United States Patent [19]

Sato

[11] 4,286,227
[45] Aug. 25, 1981

[54] TRANSISTOR AMPLIFYING CIRCUIT FOR PREVENTING THE OPERATION OF AN AMPLIFYING TRANSISTOR IN THE QUASI-SATURATION REGION

[75] Inventor: Tetsuo Sato, Fussa, Japan

[73] Assignee: Hitachi, Ltd., Tokyo, Japan

[21] Appl. No.: 52,206

[22] Filed: Jun. 26, 1979

[30] Foreign Application Priority Data

Jul. 24, 1978 [JP] Japan ................................ 53-89450

[51] Int. Cl.$^3$ .......................... H03F 3/45; H03F 3/18; H03F 1/42
[52] U.S. Cl. .................................... 330/255; 330/265; 330/267; 330/293; 330/296; 330/307
[58] Field of Search ............... 330/255, 265, 267, 271, 330/273, 293, 298, 296, 307, 207 P; 307/300

[56] References Cited

U.S. PATENT DOCUMENTS 3,482,111 12/1969 Gunderson et al. ............. 307/300 X
4,118,640 10/1978 Ochi et al. ............................ 307/237

Primary Examiner—James B. Mullins
Attorney, Agent, or Firm—Craig and Antonelli

[57] ABSTRACT

The cut-off frequency of a transistor drops remarkably when the collector-emitter voltage of the transistor is driven into the quasi-saturation region of about 1 V. To prevent this problem, the collector-emitter voltage of the transistor is detected and compared with a predetermined reference voltage by comparison-limiting means. The comparison-limiting means limits the base current of the transistor and thus restricts the drop in the collector-emitter voltage. Limiting the voltage drop in this manner prevents the transistor from being driven into the quasi-saturation region. The reference voltage is set to the p-n junction voltage in the forward direction. Hence, the drop in the collector-emitter voltage is limited to a value near this reference voltage.

9 Claims, 8 Drawing Figures

TRANSISTOR AMPLIFYING CIRCUIT FOR PREVENTING THE OPERATION OF AN AMPLIFYING TRANSISTOR IN THE QUASI-SATURATION REGION

BACKGROUND OF THE INVENTION

This invention relates to a transistor circuit for obtaining a large amplitude voltage signal from a transistor circuit such as the collector of the transistor.

A large amplitude A-class amplifying circuit is used in an operational amplifying circuit or in a low frequency power amplifying circuit or the like as a circuit for driving a push-pull output stage. In this circuit, driving transistors are caused to operate in the saturation region at the time of maximum voltage output or minimum voltage output.

The inventor has found that when the amplifying transistors operate in the saturation region or in the quasi-saturation region in this manner, the following problem occurs.

When an amplifying transistor operates in the saturation region (i.e., the operation region in which the collector-emitter voltage $V_{CE}$ is about 0.25–0.4 V), the output voltage-vs.-distortion ratio characteristic becomes a so-called "hard-clip" characteristic and comes to contain higher harmonics of especially high values. Hence, the output distortion increases and has an adverse effect on the tone quality in an audio amplifier.

On the other hand, the amplifying transistor operates in the quasi-saturation region (i.e., the operation region in which the collector-emitter voltage is about 1 V) before it reaches the saturation region. In the operation of the transistor in this quasi-saturation region, the cut-off frequency $f_T$ markedly lowers as shown in FIG. 5 whereby the phase shift of the transistor becomes great and, consequently, causes an increase in the instability of the nagative feed-back action in the negative feedback circuit.

When, for example, a driving transistor in a large amplitude A-class transistor amplifying circuit for driving two push-pull output transistors acting between two power source voltage $+V$ and $-V$, is driven into its quasi-saturation region, the push-pull output $V_{OUT}$ drops to a point immediately above the power source voltage $-V$. In this instance, the push-pull output $V_{OUT}$ is caused to exhibit a local oscillation wave form $V_{OCS}$ such as shown in FIG. 4 due to a large phase shift in the negative feed-back circuit resulting from a remarkable lowering in the cut-off frequency $f_T$.

SUMMARY OF THE INVENTION

The present invention is directed to provide a transistor amplifying circuit which prevents the operation to an amplifying transistor in the quasi-saturation region as well as the saturation region.

According to the feature of the present invention to accomplish the abovementioned object, the collector voltage of an amplifying transistor is detected so as to limit the input current immediately before the amplifying transistor enters its quasi-saturation region.

DESCRIPTION OF THE PREFERRED EMBODIMENTS

Hereinafter, the present invention will be explained more definitely with reference to preferred embodiments thereof.

Figure 1:
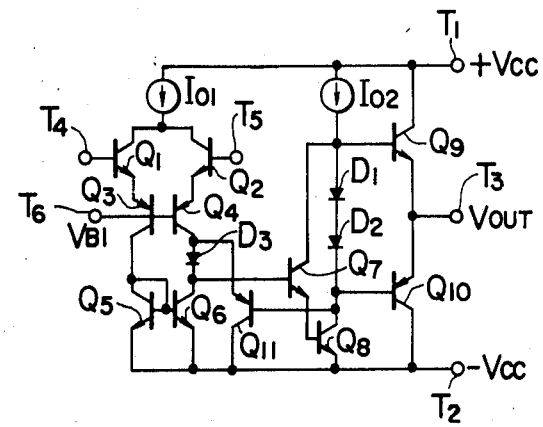
FIG. 1 is a circuit diagram of an embodiment in accordance with the present invention.

FIG. 1 is a circuit diagram when the present invention is applied to an integrated circuit for an audio equipment.

Transistors $Q_1$ and $Q_2$ are differential amplifying transistors, and constant-current circuit $I_{O1}$ is wired in common to the collectors of these transistors while transistors $Q_3$ and $Q_4$ are wired to their emitters, respectively.

A bias voltage $V_{B1}$ is applied to the bases of these bias transistors $Q_3$ and $Q_4$ and a voltage level-shifted by a base-emitter voltage value is applied as a common bias voltage to the emitters of the differential amplifying transistors $Q_1$ and $Q_2$.

A diode-connected transistor $Q_5$ is wired to the emitter of the differential amplifying transistor $Q_1$ via the bias transistor $Q_3$ while a transistor $Q_6$ is wired to the emitter of the other differential amplifying transistor $Q_2$ via the other bias transistor $Q_4$ while the base and emitter of the transistor $Q_6$ are wired mutually with those of the transistor $Q_5$, respectively.

Since these transistors $Q_5$ and $Q_6$ together form a current mirror circuit, the collector current of the transistor $Q_6$ becomes substantially equal to the emitter current of the differential amplifying transistor $Q_1$. Accordingly, there is obtained an output current from the collector of the transistor $Q_6$, the output current being the difference in the emitter current between the abovementioned differential amplifying transistors $Q_1$ and $Q_2$.

A diode $D_3$ interposed between the level-shifting transistor $Q_4$ and the current mirror transistor $Q_6$ is a level-shifting diode used for controlling an amplifying transistor that will later be described.

This differential amplifying circuit converts an input voltage signal into a current which is applied to transistors in the driving stage to be later described.

The Darlington-connected transistors $Q_7$ and $Q_8$ form an amplifying transistor in a large amplitude A-class transistor amplifying circuit and a constant-current circuit $I_{O2}$ forms its collector load means.

This circuit converts the above-mentioned driving input current signal into a voltage signal and transfers an output voltage $V_{OUT}$ to an output terminal OUT via transistors $Q_9$ and $Q_{10}$ that together form an output stage push-pull circuit.

Diodes $D_1$ and $D_2$ interposed in series with each other between the bases of the abovementioned output push-pull transistors $Q_9$ and $Q_{10}$ form a bias circuit for reducing the cross-over distortion of these transistors $Q_9$ and $Q_{10}$.

A transistor $Q_{11}$ having its base wired to the collector of the driving transistor $Q_8$, its emitter connected to the collector of the bias transistor $Q_4$ of the pre-amplification circuit and its collector connected to the negative power source voltage terminal $T_2$ forms means for detecting quasi-saturation and for restricting the input current.

In other words, the emitter voltage of this transistor $Q_{11}$ is fixed at $[V_{BEQ8}+V_{BEQ7}+V_{FD3}]$ where $V_{BEQ8}$ is the base-emitter voltage of the transistor $Q_8$ in the forward direction (approx. 0.68 V); $V_{BEQ7}$ is the base-emitter voltage of the transistor $Q_7$ in the forward direction (approx. 0.65 V); and $V_{FD3}$ is the voltage of the diode $D_3$ in the forward direction (approx. 0.68 V).

Accordingly, the transistor $Q_{11}$ is turned on and limits the base current to the driving transistor $Q_7$ when the collector-emitter voltage $V_{CEQ8}$ of the driving transistor $Q_8$ becomes substantially less than the voltage $[V_{BEQ8}+BEQ7+V_{FD3}-V_{BEQ11}]$, where $V_{BEQ11}$ is the base-emitter voltage of the transistor $Q_{11}$ in the forward direction (approx. 0.65 V).

If the collector-emitter voltage $V_{CEQ8}$ of the driving transistor $Q_8$ becomes less than about 1.33 V, therefore, the transistor $Q_{11}$ is turned on so that the voltage drop of the collector-emitter voltage $V_{CEQ8}$ is limited approximately to 1.33 V.

According to this embodiment, the collector-emitter voltage becomes about 1 V and the transistor $Q_{11}$ is turned on and restricts further increase in the input current before the operation in the quasi-saturation and saturation region where the cut-off frequency $f_T$ is markedly reduced. It is therefore possible to prevent the operation in the quasi-saturation and saturation region and to solve such problems as worsening of distortion, oscillation and so forth.

On the other hand, a diode or diodes similar to the level-shifting diode $D_3$ may be added if the collector-emitter voltage is large in the quasi-saturation region, and omitted if the collector-emitter voltage is small.

In this embodiment, when the transistor $Q_8$ operates in the unsaturated range (that is, in the active region or in the cut-off region), the transistor $Q_{11}$ is in the OFF state and a reverse bias voltage is applied across its base and emitter in accordance with the collector potential of the transistor $Q_8$. For this reason, the reverse withstand voltage $BV_{BEQQ11}$ between the base and emitter of the transistor $Q_{11}$ is set to a value substantially equal to the withstand voltage $BV_{CEOQ8}$ between the collector and emitter of the transistor $Q_8$.

The transistor $Q_{11}$ is a p-n-p type. In producing an integrated circuit, the transistor $Q_{11}$ may be of the known lateral construction that can be produced simultaneously with the production of the n-p-n type transistor $Q_8$, etc. of the vertical construction. In such a case, since the collector of the transistor $Q_8$ and the base of the transistor $Q_{11}$ are connected in common, it is possible to form the lateral type transistor $Q_{11}$ in the collector region of the transistor $Q_8$. By forming the transistors $Q_8$ and $Q_{11}$ in the common semiconductor region in this manner, it is possible to reduce an area for an isolation region than in the case where these transistors are individually formed in the semiconductor regions each independently and separately formed from the semiconductor substrate.

Figure 6:
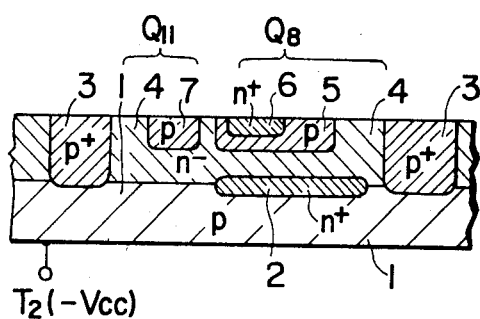
FIG. 6 is a sectional view of the integrated circuit forming the principal portion of the transistor circuit in still another embodiment of the present invention.

In the integrated circuit construction in accordance with the present invention shown in FIG. 6, since the collector of the transistor $Q_{11}$ is connected to the voltage terminal $T_2$ ($-V_{cc}$), the transistors $Q_8$ and $Q_{11}$ are formed in the same $n^-$-type semiconductor region 4 and the collector of the transistor $Q_{11}$ uses the p-type semiconductor substrate 1 while the base of the transistor $Q_{11}$ uses the $n^-$-type semiconductor region 4 formed on the p-type semiconductor substrate 1. A p-type semiconductor region 7 is formed simultaneously with the formation of a p-type base region 5 of the n-p-n transistor on the surface of this $n^-$-type semiconductor region 4 and is used as the emitter of the transistor 11. Accordingly, this p-n-p transistor $Q_{11}$ is formed in the substrate type construction.

The $n^-$-type semiconductor region 4, the p-type semiconductor region 5 and the $n^+$-type semiconductor region 6 are respectively the collector, base and emitter of the n-p-n type transistor $Q_8$ having the vertical construction.

Unlike the lateral type p-n-p transistor in which two p-type regions must be formed in juxtaposition on the surface of the n-type semiconductor region for the emitter and the collector, this substrate type p-n-p transistor requires the formation of only one p-type region on the surface of the n-type semiconductor region as described above. Hence, the necessary area becomes small on the surface of the semiconductor region. The distribution of the impurity concentration in the semiconductor region for forming the base-emitter junction of the substrate type p-n-p transistor is substantially equal to the distribution of the impurity concentration in the semiconductor region for forming the collector-base junction of the n-p-n transistor. Accordingly, the withstand voltage between the base and the emitter of the substrate type p-n-p transistor $Q_{11}$ is equal to the withstand voltage between the base and the collector of the n-p-n transistor and consequently, the normal operation of the circuit shown in FIG. 1 is not restricted.

Figure 2:
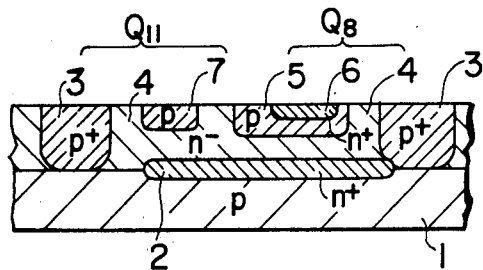
FIG. 2 is a sectional view of an integrated circuit when the principal portion of the transistor circuit shown in FIG. 1 is constructed in said integrated circuit.

In accordance with another embodiment of the present invention, the n-p-n transistor $Q_8$ and the substrate-type p-n-p transistor $Q_{11}$ are not formed in the semiconductor regions independent of each other but in a common semiconductor region, thereby reducing the necessary area for the semiconductor region. FIG. 2 shows an example of such an embodiment.

Namely, as shown in FIG. 2, an $n^-$-type epitaxial growth layer 4 formed on the p-type semiconductor substrate 1 is an element-forming region surrounded by a $p^+$-type isolation region 3. A vertical type n-p-n transistor $Q_8$ is obtained by forming the base region 5 in this element-forming $n^-$-type region 4 and the emitter region 6 in this base region 5. A substrate type p-n-p transistor $Q_{11}$ is obtained by then forming a p-type emitter region 7.

The $n^+$-type region 2 is a collector buried layer and the collector of the transistor $Q_{11}$ uses the $p^+$-type isolation region 3 and the p-type substrate 1.

Figure 3:
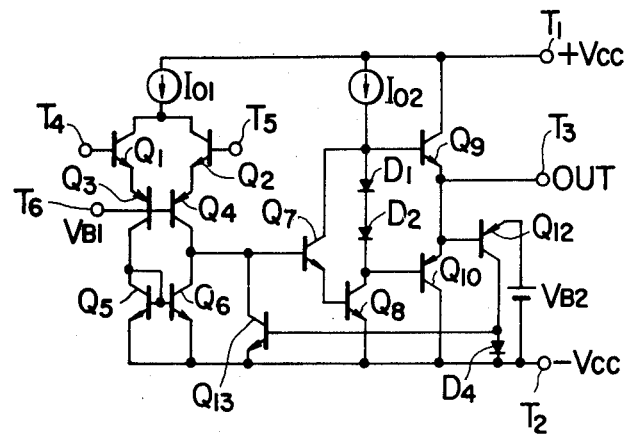
FIG. 3 is a circuit diagram of another embodiment of the present invention.
Figure 4:
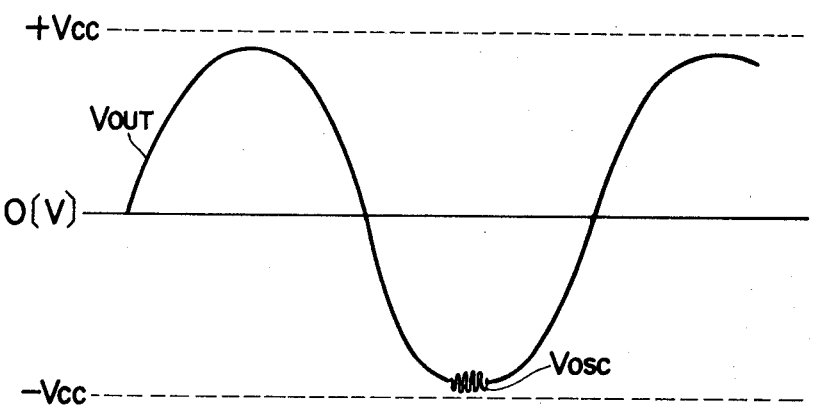
FIG. 4 is a diagram showing the waveform when the transistor is actuated in the quasi-saturation region.
Figure 5:
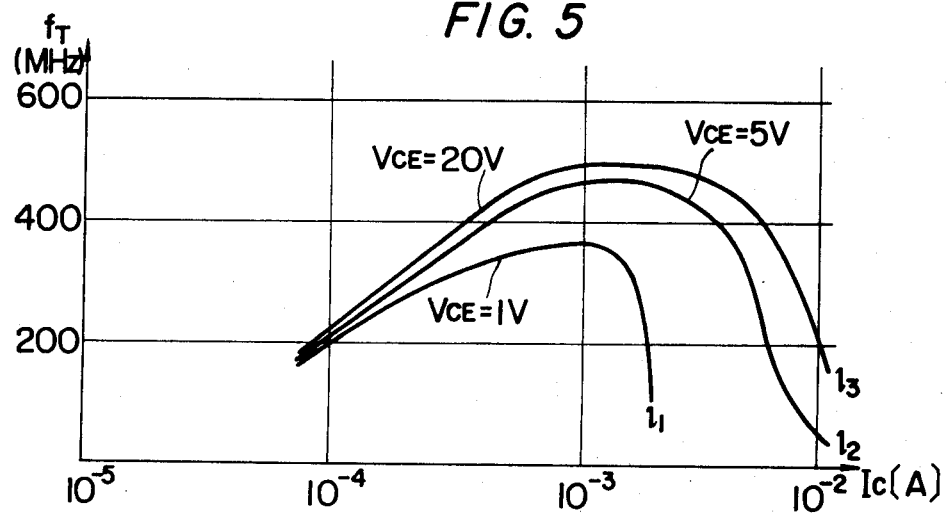
FIG. 5 is a diagram showing the dependancy of the cut-off frequency of the transistor on the collector-emitter voltage and on the collector current.

In addition to the aforementioned embodiments, voltage comparison means and current limiting means may be separated from each other in the present invention as illustrated in FIG. 3, for example.

In other words, as shown in FIG. 3, a voltage comparison circuit is formed by impressing the collector voltage of the driving transistor $Q_8$ on the base of the detection transistor $Q_{12}$ via the base-emitter junction of the output transistor $Q_{10}$ and also impressing a voltage $V_{B2}$, corresponding to a voltage to be detected, on the emitter of the transistor $Q_{12}$ and by wiring a diode $D_4$ to its collector, while a current mirror circuit is formed by arranging an input current limiting transistor $Q_{13}$ on the input side of the driving transistors $Q_7$ and $Q_8$ in cooperation with the abovementioned diode $D_4$, thereby to limit the input current.

In this circuit, when the base voltage of the transistor $Q_{12}$ becomes less than $(V_{B2}-V_{BEQ12})$ or when the collector voltage of the transistor $Q_8$ becomes less than $(V_{B2}-V_{BEQ12}-V_{BEQ10})$, the transistor $Q_{12}$ is turned on and reduces the input current in a quantity corresponding to its collector current via the transistor $Q_{13}$. It is therefore possible to prevent the operation in the quasi-saturation region by properly selecting the abovementioned voltage $V_{B2}$.

Since $V_{BEQ10}$ is about 0.68 V and $V_{BEQ12}$ is about 0.65 V and since the operation of the transistor $Q_8$ in the quasi-saturation range starts when its collector voltage $V_{CE}$ is about 1.0 V, the abovementioned voltage $V_{B2}$ is set to about 2.33 V.

In this manner, the collector voltage of the driving transistor $Q_8$ may be level-shifted by the use of the output stage circuit and then applied as an input to the voltage comparison means. Alternatively, it may be applied as an input to the voltage comparison means via the bias diodes $D_1$ and $D_2$, that is, via the base-emitter voltage of the output transistors $Q_{10}$ and $Q_9$.

Further, the present invention can be applied to a wide range of applications such as a circuit for preventing the operation in the quasi-saturation and saturation region of a large amplitude A-class amplifying circuit, in addition to the driving stage amplifying transistor circuit of a push-pull output circuit.

Figure 7:
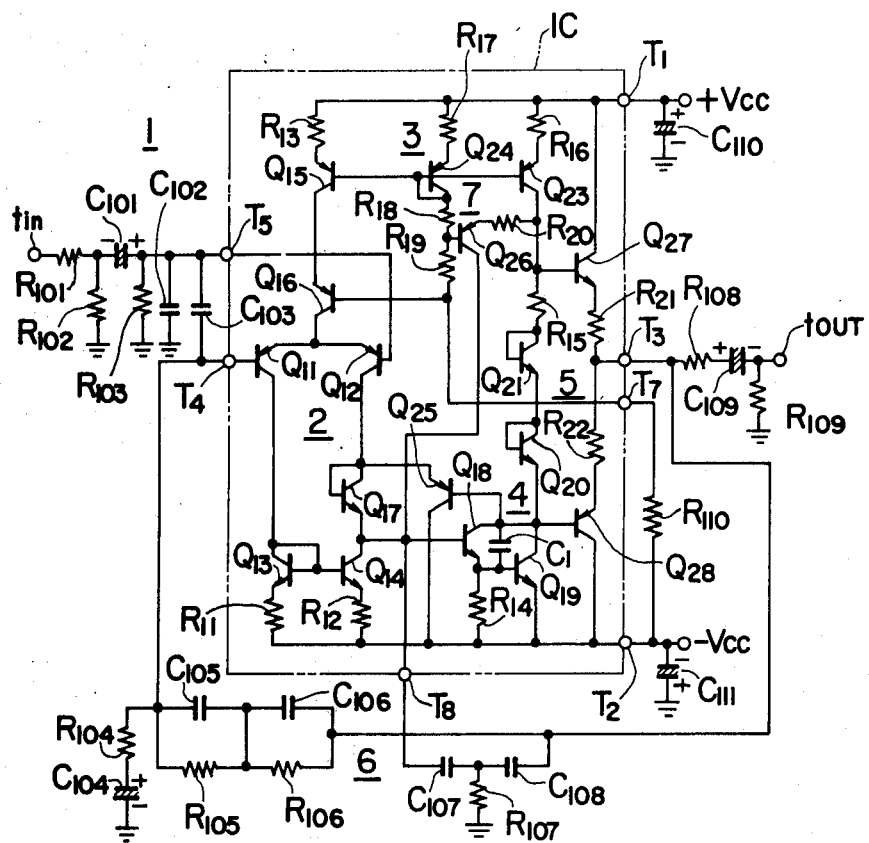
FIG. 7 is a circuit diagram of the transistor circuit in the most definite embodiment of the present invention.

FIG. 7 is a circuit diagram of the transistor amplifying circuit in accordance with the most definite embodiment of the present invention. All circuit elements in the integrated circuit encircled by the dotted line are formed in one silicon chip by the method known in the art and the circuit is formed in a monolithic semiconductor integrated circuit.

An input signal applied to the terminal tin is transmitted to a terminal $T_5$ through an input circuit 1 consisting of resistors $R_{102}-R_{103}$ and capacitors $C_{101}$ and $C_{102}$.

This signal is amplified by an initial stage differential amplifying circuit consisting of transistors $Q_{11}-Q_{17}$ and resistors $R_{11}-R_{13}$ and the amplification signal appears on the collector of the transistor $Q_{14}$. A d.c. current flowing through the differential amplifying transistors $Q_{11}$, $Q_{12}$ is set by a constant current that is supplied from the collector of a constant-current transistor $Q_{15}$.

This constant current is in turn determined by a bias current flowing through a bias circuit 3 consisting of resistors $R_{17}-R_{19}$ and a diode-connected transistor $Q_{24}$. This bias current can be adjusted by a resistor $R_{110}$ interposed between terminals $T_7$ and $T_2$ outside the integrated circuit.

A transistor $Q_{16}$ interposed between the emitters of the differential amplifying transistors $Q_{11}$, $Q_{12}$ and the collector of the constant-current transistor $Q_{15}$ is especially disposed in order to reduce the current change due to the Early effect of the transistor arising from the voltage fluctuation of the power source voltages $+Vcc$ and $-Vcc$ applied respectively to the power source terminals $T_1$ and $T_2$.

The output signal of the initial stage differential amplifying circuit 1 obtained from the collector of the transistor $Q_{14}$ is amplified by a large amplitude A-class transistor amplifying circuit 4 comprising Darlington-connected transistors $Q_{18}$ and $Q_{19}$, a resistor $R_{14}$, a phase compensating capacitor $C_1$, diode-connected transistors $Q_{20}$, $Q_{21}$ for adjustment of an idling current, a resistor $R_{15}$, a constant-current load transistor $Q_{23}$ and resistor $R_{16}$.

This signal is amplified by a B-class output push-pull circuit 5 consisting of transistors $Q_{27}$, $Q_{28}$ and resistors $R_{21}$, $R_{22}$, and is finally transmitted to the output terminal $T_3$.

A negative feed-back circuit 6 is interposed between the output terminal $T_3$ and a feed-back terminal $T_4$ in order to obtain an RIAA characteristic and this negative feed-back circuit 6 consists of resistors $R_{104}-R_{107}$ and capacitors $C_{104}-C_{108}$ as illustrated in FIG. 7.

The collectors of the transistors $Q_{18}$ and $Q_{19}$ wired in the Darlington circuit arrangement are directly connected with each other so that it is possible to make the distortion ratio of this amplifying circuit an extremely low value.

Figure 8:
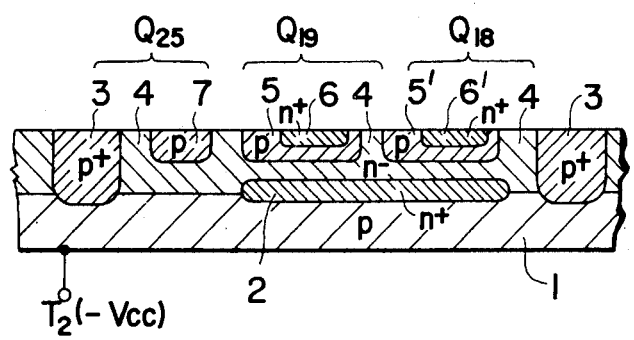
FIG. 8 is a sectional view of the integrated circuit when the principal portion of the transistor circuit shown in FIG. 7 is constructed in the semiconductor integrated circuit.

As shown in FIG. 8, both collectors of these transistors $Q_{18}$ and $Q_{19}$ are formed by a single $n^-$-type semiconductor region 4 and this region 4 can be used also as the base region for the transistor $Q_{25}$ for preventing the quasi-saturation. In other words, since these three transistors $Q_{18}$, $Q_{19}$ and $Q_{25}$ can be formed in the single element-forming region 4, the arrangement is advantageous for enhancing the integrity of the semiconductor integrated circuit. Other reference numerals 1-3, 5-7, 5" and 6" represent the same or similar regions as those in FIGS. 2 and 6.

In exactly the same way as the embodiment shown in FIG. 1, the collector-emitter voltage $V_{CEQ19}$ of the transistor $Q_{19}$ of the large amplitude A-class amplifying circuit 4 in the embodiment shown in FIG. 6 drops only to the neighborhood of 1.33 V. Hence, it is possible to prevent its quasi-saturation.

In other words, the output of the large amplitude A-class amplifying circuit 4 drops only down to the lower limit value of $-Vcc+V_{CEQ19}$. It is therefore desirable to enhance symmetry between the rising wave-form and the falling wave-form of this output by making the upper limit value of the rise in the output equal to the lower limit value of the drop in the output. A limiter circuit 7 consisting of a transistor $Q_{26}$ and a resistor $R_{20}$ is disposed for that purpose. The limiter action of this limiter circuit is accomplished when the transistor $Q_{26}$ becomes conductive. As a result, a base current is fed to the base of the transistor $Q_{18}$, thereby limiting the rise in the output of the large amplitude A-class amplifying circuit 4 and enabling the abovementioned symmetry of the waveforms to be obtained.

What is claimed is:

1. A transistor circuit comprising:
   a first transistor;
   a second transistor of the same conduction type as said first transistor;
   a third transistor of the opposite conduction type to said first transistor and having its collector connected to the emitter of said first transistor; and level-shift diode means;
   said first transistor and said second transistor being connected with each other in a Darlington circuit arrangement;
   said second transistor forming the prestage of the Darlington circuit arrangement and said first transistor forming its post-stage;

the base of said third transistor being connected to the collector of said first transistor;

the base of said second transistor being connected to the emitter of said third transistor via said level-shift diode means.

2. The transistor circuit as defined in claim 1 wherein said first and second transistors each are a vertical type n-p-n transistor formed in a semiconductor integrated circuit, said third transistor is a substrate type p-n-p transistor using the p-type semiconductor substrate of said semiconductor integrated circuit as at least a part of its collector region, and the collector region of said first transistor and the base region of said third transistor are formed by a single n-type element-forming region disposed on said p-type semiconductor substrate.

3. The transistor circuit as defined in claim 2 wherein the collector region of said second transistor is further formed by said single n-type element-forming region so that the collector of said first transistor and the collector of said second transistor are commonly connected.

4. The transistor circuit as defined in claim 1 wherein said transistor circuit further includes:
an initial stage differential amplifying circuit;
collector load means for said first and second Darlington-connected transistors;
a B-class push-pull circuit; and
a negative feed-back circuit interposed between the output of said B-class push-pull circuit and either one of two inputs of said initial stage differential amplifying circuit;
said first and second transistors in the Darlington circuit arrangement being driven by the output of said initial stage differential amplifying circuit and forming, together with said collector load means, a large amplitude A-class transistor amplifying circuit so as to drive said B-class push-pull circuit.

5. A transistor circuit comprising:
a first transistor and a second transistor, each having of the n-p-n type;
a p-n-p type third transistor having its collector connected to the emitter of said first transistor; and
level-shift diode means;
said first and second transistors being connected with each other in a Darlington circuit arrangement;
said second transistor forming the prestage of the Darlington circuit arrangement and said first transistor forming its post-stage;
the collector of said first transistor being connected to the base of said third transistor;
the base of said second transistor being connected to the emitter of said third transistor via said level-diode means.

6. A transistor circuit comprising:
a transistor; and
a detection-comparison circuit for detecting the collector-emitter voltage of said transistor and for comparing said collector-emitter voltage with a reference voltage, wherein said reference voltage is set to a voltage corresponding to approximately twice the p-n junction voltage in the forward direction, said detection-comparison circuit including means for limiting the base current of said transistor before said transistor is driven to the quasi-saturation region and for limiting the drop of said collector-emitter voltage of said transistor near said reference voltage.

7. A transistor circuit comprising:
a transistor; and
a circuit for detecting the collector-emitter voltage of said transistor and for comparing the detected voltage with a reference voltage, said detection-comparison circuit including means for limiting the base current of said transistor so as to limit the drop of said collector-emitter voltage of said transistor above IV.

8. The transistor circuit as defined in claim 7, wherein said detection-comparison circuit limits the drop of said collector-emitter voltage to 1.33 V, approximately.

9. A transistor circuit comprising:
a first transistor;
a first p-n junction device, the one terminal of which is connected to the base of said first transistor;
a second p-n junction device, the one terminal of which is connected to the other terminal of said first p-n junction device; and
a control transistor of the opposite conduction type to said first transistor, the emitter of which is connected to the other terminal of said second p-n junction device;
wherein said first p-n junction device and said second p-n junction device are connected in the forward directions between said emitter of said control transistor and said base of said first transistor, the base and the collector of said control transistor being connected to the collector and the emitter of said first transistor, respectively.

* * * * *